(12) United States Patent
Asami

(10) Patent No.: US 12,381,585 B2
(45) Date of Patent: Aug. 5, 2025

(54) SIGNAL GENERATOR

(71) Applicant: ADVANTEST CORPORATION, Tokyo (JP)

(72) Inventor: Koji Asami, Tokyo (JP)

(73) Assignee: ADVANTEST CORPORATION, Tokyo (JP)

( * ) Notice: Subject to any disclaimer, the term of this patent is extended or adjusted under 35 U.S.C. 154(b) by 21 days.

(21) Appl. No.: 18/476,660

(22) Filed: Sep. 28, 2023

(65) Prior Publication Data

US 2024/0022270 A1  Jan. 18, 2024

Related U.S. Application Data

(63) Continuation of application No. PCT/JP2022/017608, filed on Apr. 12, 2022.

(30) Foreign Application Priority Data

May 7, 2021 (JP) ................................. 2021-079304

(51) Int. Cl.
    *H04B 1/04* (2006.01)
    *H03M 1/06* (2006.01)

(52) U.S. Cl.
    CPC ............ *H04B 1/04* (2013.01); *H03M 1/0607* (2013.01)

(58) Field of Classification Search
    CPC ........... H03D 7/14; H03M 1/12; H03M 1/66; H03M 1/74; H03M 1/0607; H04B 1/00; H04B 1/04; H04B 1/66; H04B 17/00

USPC .......... 327/361; 341/140–154; 375/144, 219, 375/241, 244, 281, 295–297, 322, 347

See application file for complete search history.

(56) References Cited

U.S. PATENT DOCUMENTS 9,407,280 B1 *  8/2016  Pickerd .............. H03M 1/1215
2009/0052556 A1   2/2009  Fernandez
(Continued)

FOREIGN PATENT DOCUMENTS

JP  2001016117 A  1/2001
JP  2013507043 A  2/2013
(Continued)

OTHER PUBLICATIONS

PCT International Preliminary Report on Patentability with PCT Written Opinion of the International Searching Authority for International Application No. PCT/JP2022/017608; Mailing Date, Oct. 24, 2023.

(Continued)

*Primary Examiner* — Shawkat M Ali
(74) *Attorney, Agent, or Firm* — CANTOR COLBURN LLP

(57) ABSTRACT

N (N≥2) D/A converters convert respective input data at a sampling frequency $F_S$. A digital signal processing unit generates N items of sub-band waveform data. Each of N items of sub-band waveform data is generated by frequency-shifting corresponding one of N sub-band components included in digital waveform data that represents the analog output signal, such that each sub-band waveform data has its maximum frequency below $F_S/2$. A local signal generating circuit generates N local signals having different frequencies.

12 Claims, 6 Drawing Sheets

(56) References Cited

U.S. PATENT DOCUMENTS

2018/0302111 A1* 10/2018 Chen ...................... H04B 1/525
2020/0266842 A1*  8/2020 Patel ........................ H04B 1/04

FOREIGN PATENT DOCUMENTS

| JP | 2014187693 A | 10/2014 |
| JP | 2018078403 A | 5/2018 |

OTHER PUBLICATIONS

International Search Report for International Application No. PCT/JP2022/017608; Mailing Date, Jul. 19, 2022.

* cited by examiner

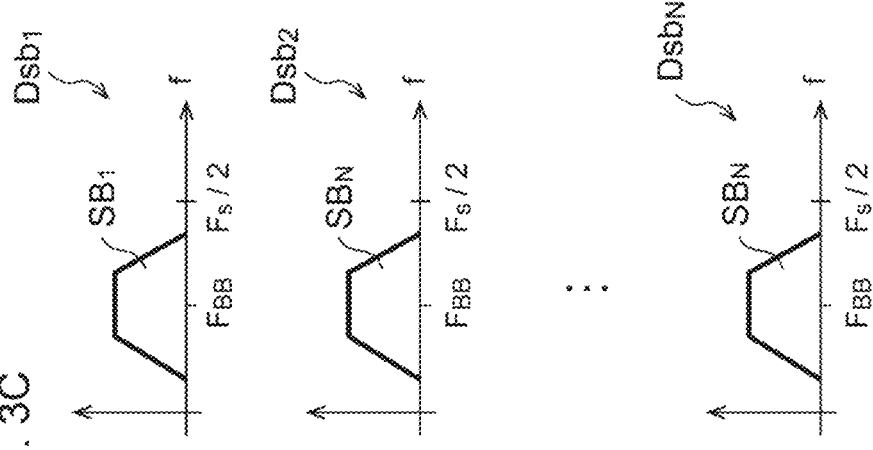
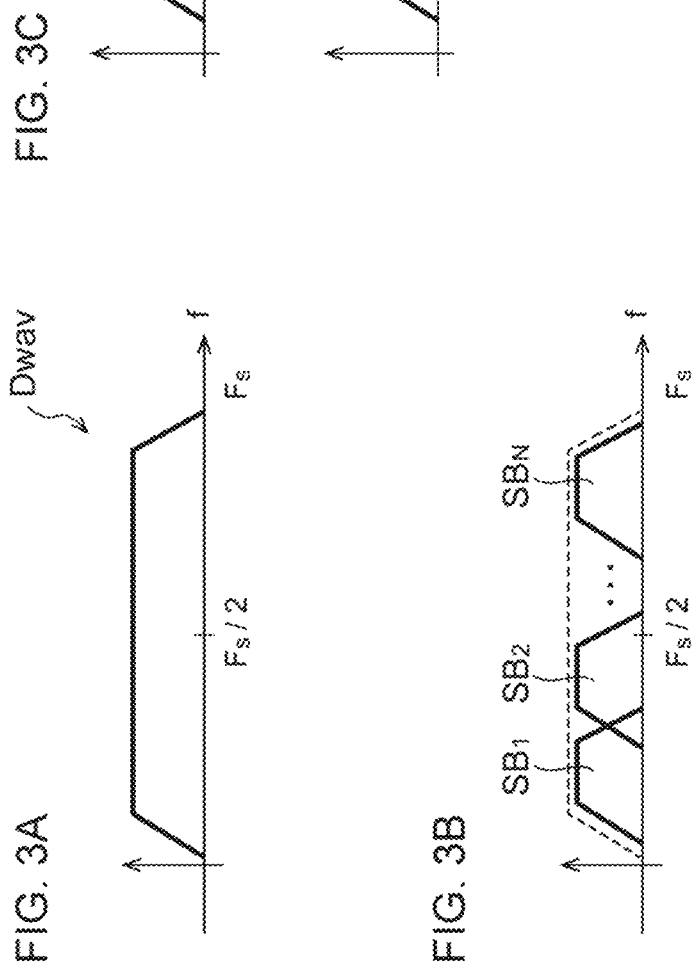

FIG. 4A
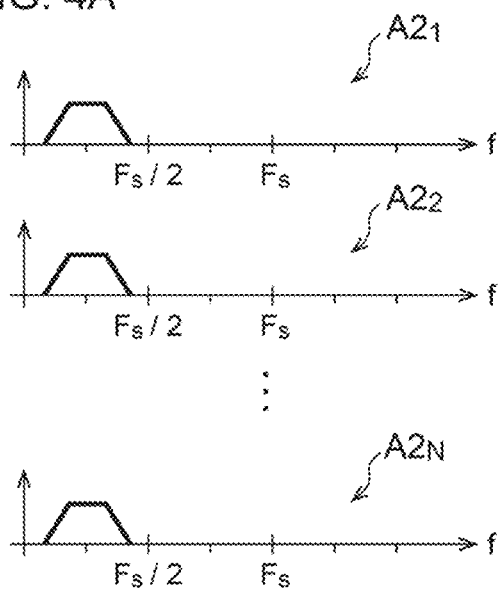
FIG. 4B
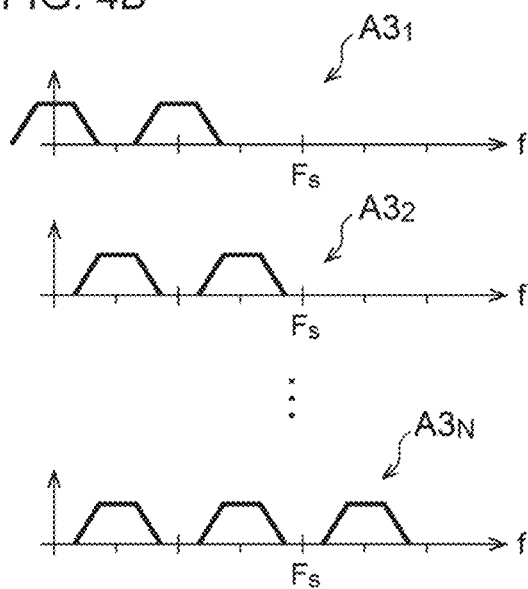
FIG. 4C
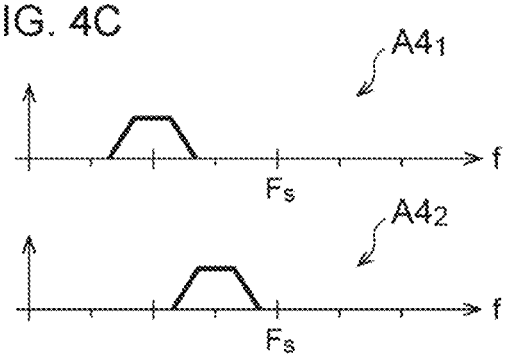
FIG. 4D
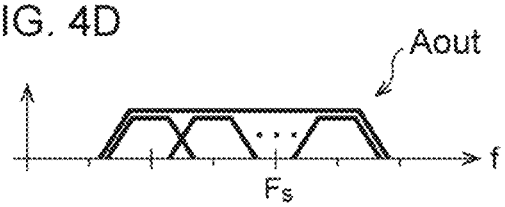
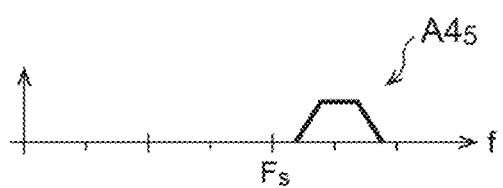

SIGNAL GENERATOR

CROSS REFERENCES TO RELATED APPLICATIONS

This application is a continuation under 35 U. S. C. § 120 of PCT/JP2022/017608, filed Apr. 12, 2022, which is incorporated herein by reference, and which claimed priority to Japanese Application No. 2021-079304, filed May 7, 2021. The present application likewise claims priority under 35 U.S.C. § 119 to Japanese Application No. 2021-079304, filed May 7, 2021, the entire content of which is also incorporated herein by reference.

BACKGROUND

1. Technical Field

The present disclosure relates to a signal generator.

2. Description of the Related Art

In the fifth-generation (5G) mobile communication systems that have begun to come into commonplace use, the sixth-generation (6G) mobile communication systems in the future, the sixth-generation WiFi (trademark) standard (IEEE 802.11ax), etc., the frequencies of signals handled in an electronic circuit have been steadily increasing. As an essential technique, a high-speed arbitrary waveform generator (signal generator) is required.

Such a high-speed arbitrary waveform generator requires a D/A converter having a wide bandwidth. A time-interleaved method is known configured to provide an extended signal bandwidth using a combination of multiple D/A converters as compared with a single D/A converter.

FIG. 1 is a block diagram showing a two-channel time-interleaved D/A converter 10R. The D/A converter 10R includes two D/A converters 12 and 14, an adder 16, and a low-pass filter 18. The original waveform data is sampled with a sampling period $T_S$ (sampling frequency $F_S=1/T_S$). The original waveform data is upsampled to a sampling frequency of $2 \times F_S$. The original waveform data is divided into two systems, i.e., first waveform data WD1 configured as an odd-numbered sample group and second waveform data WD2 configured as an even-numbered sample group, and the two divided data groups are output.

The first waveform data WD1 and the second waveform data WD2 are converted into analog signals by means of the two D/A converters 12 and 14. In principle, the bandwidth of such a D/A converter is limited due to zero-order hold characteristics. In order to improve such a bandwidth limitation, the hold time is reduced to $T_S/2$, which is shorter than the sampling period $T_S$. With this, the outputs of the D/A converters 12 and 14 each have a Return to Zero (RZ) waveform. Sampling clocks CLK1 and CLK2 having opposite phases are input to the D/A converters 12 and 14, respectively.

The adder 16 adds analog RZ waveforms RZ1 and RZ2 output from the two D/A converters 12 and 14. Furthermore, the low-pass filter 18 removes high-frequency components so as to generate a wide-band waveform sampled with the sampling period $T_S/2$ (sampling frequency $2 \times F_S$).

A waveform generator using time interleaving is disclosed in Patent document 1 (Japanese Patent Application Laid Open No. 2014-187693). In Patent document 1, a time interleaving technique is disclosed employing an analog/digital harmonic signal including a DC component (zero-order) and a harmonic component (e.g., first-order harmonic component) and an analog/digital harmonic signal including the DC component (zero-order) and a harmonic component (e.g., first-order harmonic component) having an opposite phase instead of employing an RZ waveform.

The time interleaving method shown in FIG. 1 requires the RZ waveform to be generated with a zero-order hold time of $T_S/2$, leading to the occurrence of waveform distortion. Furthermore, such a time interleaving method has a problem of reduction of the signal amplitude and a problem of difficulty in correction of mismatch characteristics between channels.

SUMMARY

The present disclosure has been made in view of such a situation. Accordingly, it is an exemplary purpose thereof to provide a signal generator that is capable of generating a high-speed analog arbitrary waveform signal using a method that differs from the time interleaving method.

An embodiment of the present disclosure relates to a signal generator structured to generate an analog output signal. The signal generator includes: a plurality of N (N≥2) D/A converters each structured to D/A convert input data at a sampling frequency $F_S$; a digital signal processing unit structured to generate N items of sub-band waveform data, and to supply the N items of sub-band waveform data to the N D/A converters; N first filters that correspond to the N D/A converters; a local signal generating circuit structured to generate N local signals that correspond to the N sub-band components; N analog frequency mixers that correspond to the N first filters; N second filters that correspond to the N analog frequency mixers; and a combiner structured to combine output signals of the N second filters. Each of the N items of sub-band waveform data is generated by frequency-shifting corresponding one of sub-band components includes in digital waveform data that represents the analog output signal, such that each of the N items of sub-band waveform data has its maximum frequency below $F_S/2$. Each of the N D/A converters converts the corresponding one of the N items of sub-band waveform data at a sampling frequency $F_S$. Each of the N first filters filters an output signal of the corresponding one of the N D/A converters. The N local signals generated by the local signal generating circuit each have a frequency that corresponds to the difference between the center frequency of the corresponding one of the N sub-band components and the center frequency of the N items of sub-band waveform data. The N analog frequency mixers each frequency-mix the output signal of the corresponding one of the N first filters with the corresponding one of the N local signals. The N second filters each filter the output signal of the corresponding one of the N analog frequency mixers.

Another embodiment of the present disclosure relates to a generating method for generating an analog output signal. The generating method includes the following processing. That is to say, the generating method includes:
    providing a plurality of N (N≥2) D/A converters each structured to operate at a sampling frequency $F_S$;
    generating a plurality of N items of sub-band waveform data, wherein each of the N items of sub-band is generated by frequency-shifting a corresponding one of N sub-band components included in digital waveform data that represents the analog output signal, such that each of the N items of sub-band waveform data has its maximum frequency below $F_S/2$;

generating a plurality of N first signals by means of N D/A converters; D/A converting, by the N D/A converters, corresponding ones of the N items of sub-band waveform data;

filtering the N first signals so as to generate N second signals;

generating N local signals that correspond to the N sub-band components such that the N local signals each have a frequency that corresponds to a difference between the center frequency of a corresponding one of the N sub-band components and the center frequency of the N items of sub-band waveform data;

frequency-mixing each of the N second signals with a corresponding one of the N local signals so as to generate N third signals;

filtering the N third signals so as to generate N fourth signals; and combining the N fourth signals so as to generate the analog output signal.

It should be noted that any combination of the components described above or any manifestation thereof may be mutually substituted between a method, apparatus, or the like, which are also effective as an embodiment of the present invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIG. 3A through FIG. 3C are diagrams for explaining processing in a digital domain by a signal generator.

FIG. 4A through FIG. 4D are diagrams for explaining processing in an analog domain by a signal generator.

DETAILED DESCRIPTION

Outline of Embodiments

Figure 1:
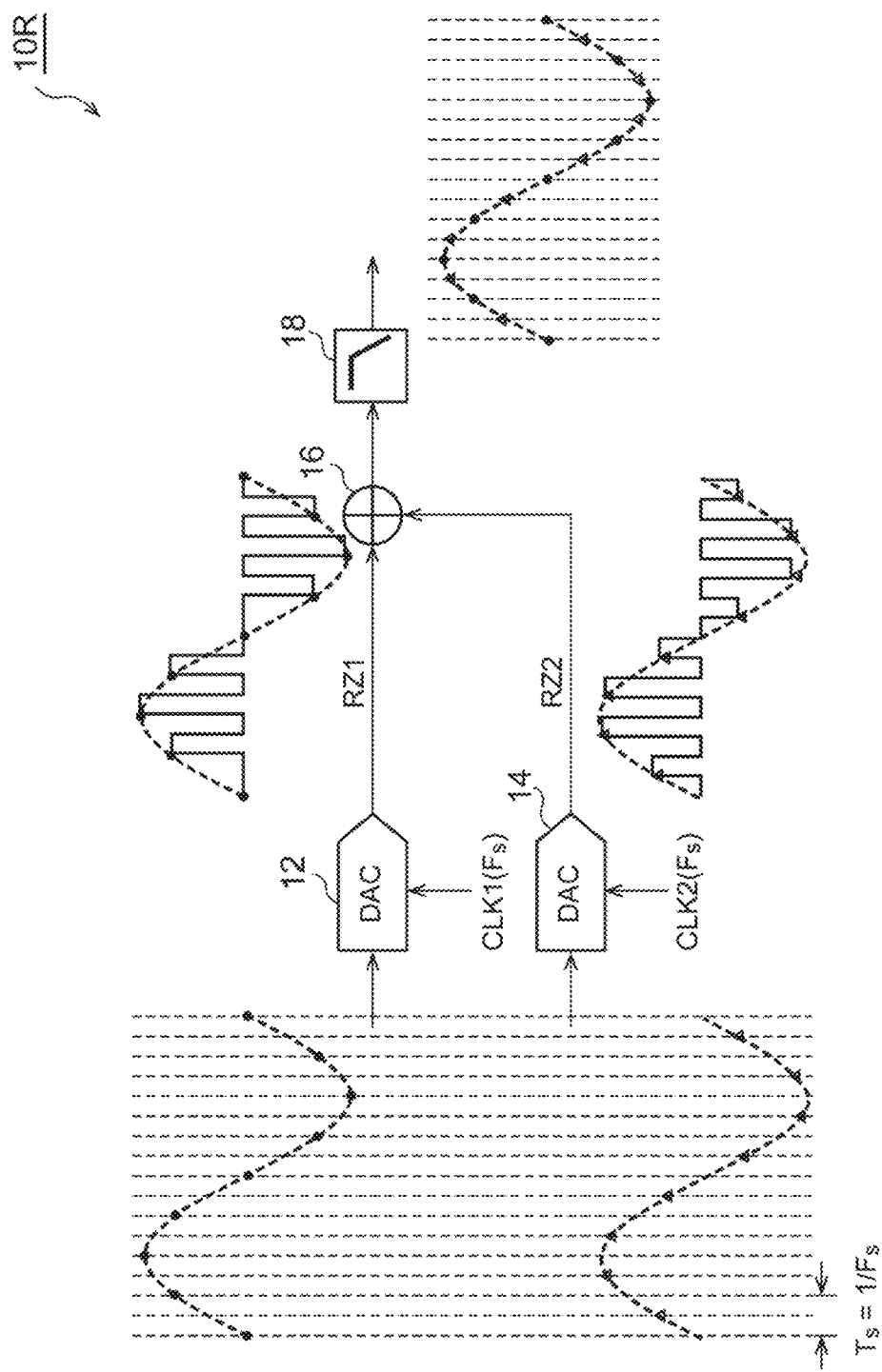
FIG. 1 is a block diagram showing a two-channel time interleaving D/A converter.

Description will be made regarding the outline of several exemplary embodiments of the present disclosure. The outline is a simplified explanation regarding several concepts of one or multiple embodiments as a preface to the detailed description described later in order to provide a basic understanding of the embodiments. That is to say, the outline described below is by no means intended to restrict the scope of the present invention and the present disclosure. For convenience, in some cases, an "embodiment" as used in the present specification represents a single or multiple embodiments (examples and modifications) disclosed in the present specification.

The outline is by no means a comprehensive outline of all possible embodiments. That is to say, the outline is by no means intended to identify the indispensable or essential elements of all the embodiments and is by no means intended to define the scope of a part of or all the embodiments. The sole purpose of the outline to is to present several concepts of one or multiple embodiments in a simple form as a prelude to the detailed description described later.

A signal generator according to one embodiment generates an analog output signal. The signal generator includes a digital signal processing unit, a plurality of N (N≥2) D/A converters, N first filters, a local signal generating circuit, N analog frequency mixers, N second filters, and a combiner. The digital signal processing unit generates N items of sub-band waveform data. Each of the N items of sub-band waveform data is generated by frequency-shifting a corresponding one of the N sub-band components included in digital waveform data such that its center frequency matches a baseband frequency $F_{BB}$. The N D/A converters correspond to the N items of sub-band waveform data. Each of the N D/A converters converts the corresponding one of the N items of sub-band waveform data at a sampling frequency $F_S$. The N first filters correspond to the N D/A converters. The N first filters each filter an output signal of the corresponding one of the N D/A converters. The local signal generating circuit generates N local signals that correspond to the N sub-band components. The N local signals each have a frequency that corresponds to the difference between the center frequency of the corresponding one of the N sub-band components and the baseband frequency $F_{BB}$. The N analog frequency mixers correspond to the N first filters. The N analog frequency mixers each frequency-mix the output signal of the corresponding one of the N first filters with the corresponding one of the N local signals. The N second filters correspond to the N analog frequency mixers. The N second filters each filter the output signal of the corresponding one of the N analog frequency mixers. The combiner combines the output signals of the N second filters.

With this arrangement, this is capable of generating a high-speed arbitrary waveform using a method (which will be referred to as "frequency interleaving" in the present specification) that differs from conventional time interleaving. The frequency interleaving requires N D/A converters each operating at the same operating speed that is lower than the frequency of the analog output signal in the final stage. This allows the performance required for the D/A converters to be reduced as compared the with conventional time interleaving methods.

In one embodiment, with N, M, and L as integers where N≥3 and L>M, a difference between two adjacent center frequencies of the N sub-band components may be $F_S \cdot M/L$. This allows the N sub-band components to be designed to have the same bandwidth. As a result, this allows multiple channels to have the same configuration in the stages downstream from the D/A converter.

In one embodiment, L/M may be an integer. Also, L/M=N may hold true.

In one embodiment, N≥3 may hold true. Also, the N local signals may have frequencies $F_S/N$, $2F_S/N$, $N \cdot F_S/N$. With such an arrangement in which the N local signals are each designed to have a frequency that is an integer multiple of $F_S/N$, this is capable of generating the multiple local signals in a simple manner.

In one embodiment, the local signal generating circuit may further generate a synchronization signal indicating a timing at which phases of the N local signals align.

In one embodiment, the digital signal generating unit may start to output the N items of sub-band waveform data with the synchronization signal as a trigger. This is capable of generating an analog output signal with improved accuracy.

In one embodiment, the local signal generating circuit may include a frequency-dividing circuit configured to divide the frequency of a common clock signal with different frequency-dividing ratios, so as to generate N local signals. With such an arrangement employing such a frequency divider, this is capable of generating N local signals with synchronized phases.

In one embodiment, the N first filters may be configured as low-pass filters having the same cutoff frequency.

In one embodiment, the N second filters may be configured as bandpass filters having different pass bands.

In one embodiment, the digital signal generating unit may correct a mismatch between multiple paths downstream from the N D/A converters.

In one embodiment, the digital signal generating unit may correct skew that occurs between the multiple paths.

In one embodiment, the digital signal processing unit may correct a mismatch of frequency characteristics between multiple paths. Examples of the frequency characteristics of each path include the frequency characteristics of the first filter, the frequency characteristics of the analog frequency mixer, the frequency characteristics of the second filter, and the frequency characteristics of a transmission path that couples such components. That is to say, the digital signal processing unit may correct at least one of an inter-channel mismatch between the frequency characteristics of the first filters, an inter-channel mismatch between the frequency characteristics of the analog frequency mixers, and an inter-channel mismatch between the frequency characteristics of the second filters.

EMBODIMENTS

Figure 2:
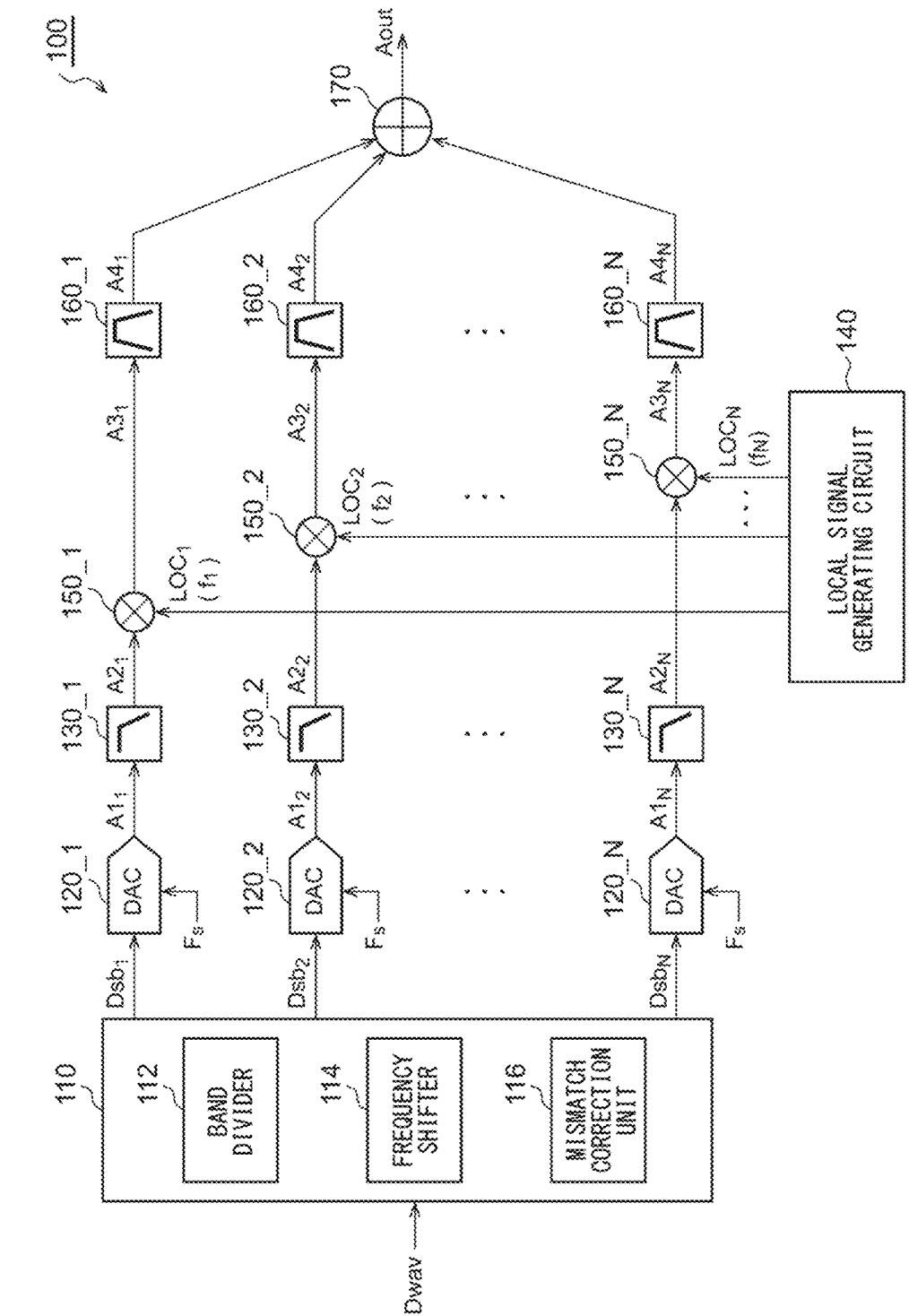
FIG. 2 is a block diagram of a signal generator according to an embodiment.

FIG. 2 is a block diagram of a signal generator 100 according to an embodiment. The signal generator 100 receives digital waveform data Dwav that represents an analog output signal Aout and generates the analog output signal Aout. The frequency of the analog output signal Aout is not restricted in particular. Specifically, the frequency of the analog output signal Aout may be several hundred MHz or more, e.g., on the order of GHz.

The signal generator 100 includes a digital signal processing unit 110, a plurality of N (N≥2) D/A converters 120, N first filters 130_1 through 130_N, a local signal generating circuit 140, N analog frequency mixers 150_1 through 150_N, N second filters 160_1 through 160_N, and a combiner 170. Here, "N" represents the number of channels.

The D/A converters 120_1 through 120_N each operate at a sampling frequency $F_S$. In the present embodiment, the maximum frequency of the digital waveform data Dwav exceeds the Nyquist frequency of the D/A converter 120, i.e., $F_S/2$.

The digital signal processing unit 110 generates N items of sub-band waveform data $Dsb_1$ through $Dsb_N$. The N items of sub-band waveform data $Dsb_1$ through $Dsb_N$ each include a corresponding one of the N sub-band components $SB_1$ through $SB_N$ obtained by dividing the digital waveform data Dwav into N items of sub-band data, in which the maximum frequency is shifted to a frequency band that is lower than $F_S/2$ (i.e., the Nyquist frequency of the D/A converter 120) (frequency down-conversion).

The digital signal processing unit 110 includes a band divider 112 and a frequency shifter 114. The band divider 112 divides the digital waveform data Dwav into N divisions, i.e., N sub-band components $SB_1$ through $SB_N$, in the frequency domain. Description will be made with the center frequencies of the N sub-band components $SB_1$ through $SB_N$ as "$F_1$" through "$F_N$".

The frequency shifter 114 shifts each of the N sub-band components $SB_1$ through $SB_N$ such that its maximum frequency is lower than $F_S/2$, so as to generate N items of sub-band waveform data $Dsb_1$ through $Dsb_N$. The center frequency after the frequency shifting will be referred to as a "baseband frequency $F_{BB}$".

The digital signal processing unit 110 may provide its processing based in the time domain. In this case, the band divider 112 may be configured as multiple digital filters. The frequency shifter 114 may be configured as a digital frequency mixer.

Alternatively, the digital signal processing unit 110 may provide its processing in the frequency domain. In this case, the band divider 112 may convert the digital waveform data Dwav into spectrum data and divide the spectrum data into N sub-band components. The frequency shifter 114 may preferably shift the spectrums of the N sub-band components $SB_1$ through $SB_N$ on the frequency axis.

The digital signal processing unit 110 may be configured as a Digital Signal Processor (DSP). Also, the digital signal processing unit 110 may be configured as a digital hardware component such as a Field Programmable Gate Array (FPGA) or the like. Also, the digital signal processing unit 110 may be configured as a combination of a processor such as a Central Processing Unit (CPU), microcontroller, or the like, and a software program.

The N D/A converters 120_1 through 120_N correspond to the N items of sub-band waveform data $Dsb_1$ through $Dsb_N$. The i-th D/A converter 120_$i$ ($1 \leq i \leq N$) converts one of the N items of sub-band waveform data $Dsb_1$ through $Dsb_N$, i.e., $Dsb_i$, at the sampling frequency $F_S$, so as to generate a first signal $A1_i$.

The N first filters 130_1 through 130_N correspond to the N D/A converters 120_1 through 120_N, respectively. The i-th first filter 130_$i$ filters an output signal (first signal) $A1_i$ of the corresponding one of the N D/A converters 120_1 through 120_N, i.e., 120_$i$, so as to generate a second signal $A2_i$. The N first filters 130_1 through 130_N may each be configured as an analog low-pass filter having the same cutoff frequency.

The local signal generating circuit 140 generates N local signals $LOC_1$ through $LOC_N$ that correspond to the N sub-band components $SB_1$ through $SB_N$. The i-th local signal $LOC_1$ has a frequency (local frequency) $f_i = F_i - F_{BB}$ that corresponds to the difference between the center frequency $F_i$ of the corresponding one, i.e., $SB_i$, from among the N sub-band components $SB_1$ through $SB_N$ and the center frequency (baseband frequency) $F_{BB}$ of the N items of sub-band waveform data $Dsb_1$ and $Dsb_N$. The local frequency $f_1$ through $f_N$ may each be designed to be higher than the sampling frequency $F_S$.

The N analog frequency mixers 150_1 through 150_N correspond to the N first filters 130_1 through 130_N, respectively. The i-th analog frequency mixer 150_$i$ frequency-mixes the second signal $A2_i$ that is the output of the corresponding one, i.e., 130_$i$, from among the N first filters 130_1 through 130_N with the corresponding one, i.e., $LOC_1$, from among the N local signals $LOC_1$ through $LOC_N$, so as to generate a third signal $A3_i$. The second signal $A2_i$, which is the output of the first filter 130_$i$, is frequency-upconverted by the i-th analog frequency mixer 150_$i$. The frequency of the third signal $A3_i$ thus upconverted is represented by $F_S + f_i = F_S + (F_i - F_S) = F_i$, which matches the frequency $F_i$ of the original sub-band SB.

The N second filters 160_1 through 160_N correspond to the N analog frequency mixers 150_1 through 150_N, respectively. The i-th second filter 160_$i$ filters the corresponding one, 150_*i*, from among the N analog frequency mixers 150_1 through 150_N so as to remove unnecessary image components, thereby generating a fourth signal $A4_i$. The second filters 160_1 through 160_N can be configured as bandpass filters having different pass bands.

The combiner 170 combines the fourth signals $A4_i$ through $A4_N$ generated by the N second filters 160_1 through 160_N. The combiner 170 may be configured as an analog adder that adds the fourth signals $A4_1$ through $A4_N$. Also, the combiner 170 may be configured as a multiplexer that multiplexes the fourth signals $A4_1$ through $A4_N$.

The above is the configuration of the signal generator 100. Next, description will be made regarding the operation thereof classified into two operations, i.e., the operation in the digital domain (i.e., digital signal processing unit 110) and the operation in the analog domain (first filter 130 to combiner 170).

FIGS. 3A through 3C are diagrams for explaining the operation of the signal generator 100 in the digital domain provided. FIG. 3A shows a spectrum of the digital waveform data Dwav that represents the analog output signal Aout. FIG. 3B shows the sub-band components $SB_1$ through $SB_N$ obtained by dividing the spectrum of the digital waveform data Dwav into N components in frequency domain. The center frequencies of the sub-band components SB 1 through $SB_N$ are represented by $F_1$ through $F_N$, respectively. FIG. 3C shows the spectrums of the N items of sub-band waveform data $Dsb_1$ through $Dsb_N$. The N items of sub-band waveform data $Dsb_1$ through $Dsb_N$ each have the same center frequency $F_{BB}$.

FIGS. 4A through 4D are diagrams for explaining the operation of the signal generator 100 in the analog domain. FIG. 4A shows the spectrums of the second signals $A2_1$ through $A2_N$ obtained by applying low-pass filtering to the N items of sub-band waveform data $Dsb_1$ through $Dsb_N$ after they are D/A converted.

FIG. 4B shows the spectrums of the third signals $A3_1$ through $A3_N$ obtained by upconverting the second signals $A2_1$ through $A2_N$. The third signals $A3_1$ through $A3_N$ each include an image component accompanying the frequency mixing. By removing the image component by means of the second filter 160, fourth signals $A4_1$ through $A4_N$ shown in FIG. 4C are obtained. FIG. 4D shows the spectrum of the analog output signal Aout obtained by combining the fourth signals $A4_i$ through $A4_N$.

The above is the basic operation of the signal generator 100.

With the signal generator 100, this is capable of generating a high-speed arbitrary waveform by frequency interleaving. With such an arrangement employing the frequency interleaving, this requires only the N D/A converters that operate with the same speed, which is lower than the frequency of the analog output signal in the final stage. Accordingly, this allows the performance required for each D/A converter to be reduced as compared with conventional time interleaving techniques.

Description will be made returning to FIG. 2. The digital signal processing unit 110 may further include a mismatch correction unit 116. The mismatch correction unit 116 mainly corrects a mismatch between multiple paths (channels) in the analog domain including the D/A converters.

For example, the mismatch correction unit 116 may correct skew between the multiple paths. In this case, typically, "skew" can be understood as propagation delay. However, the present invention is not restricted to such an arrangement. In a case in which the multiple paths have different skews, the mismatch correction unit 116 corrects the multiple items of sub-band waveform data $Dsb_1$ through $Dsb_N$ (pre-distortion) giving consideration to the skew mismatch for each channel. Specifically, the correction is an offset on the time axis.

The mismatch correction unit 116 may correct frequency characteristics mismatches between the multiple paths (channels). The frequency characteristics of each path are determined by the frequency characteristics of the first filter 130, the frequency characteristics of the analog frequency mixer 150, the frequency characteristics of the second filter 160, and the frequency characteristics of a transmission path that connects the components described above. That is to say, the mismatch correction unit 116 may correct at least one of inter-channel mismatch between the frequency characteristics of the first filters 130, inter-channel mismatch between the frequency characteristics of the analog frequency mixers 150, and inter-channel mismatch between the frequency characteristics of the second filters 160. Such a correction may be applied to the total frequency characteristics for each channel. Also, by individually correcting inter-channel mismatch between the first filters, inter-channel mismatch between the second filters, and inter-channel mismatch between the analog frequency mixers, such an arrangement may correct inter-channel mismatch between the total frequency characteristics.

The frequency characteristics may include one of the gain and phase, or both of them. For example, in a case in which the gain of a given channel is higher (lower) than the other channels, the signal level of the sub-band waveform data Dsb of the given channel may be reduced (raised).

The correction by the digital signal processing unit 110 is not restricted to the correction of inter-channel mismatch. For example, in a case in which inter-channel mismatch is negligible, pre-correction may be made in the digital domain so as to uniformly correct the frequency characteristics of all the channels.

Next, specific description will be made regarding an example of the signal generator 100.

Figure 5:
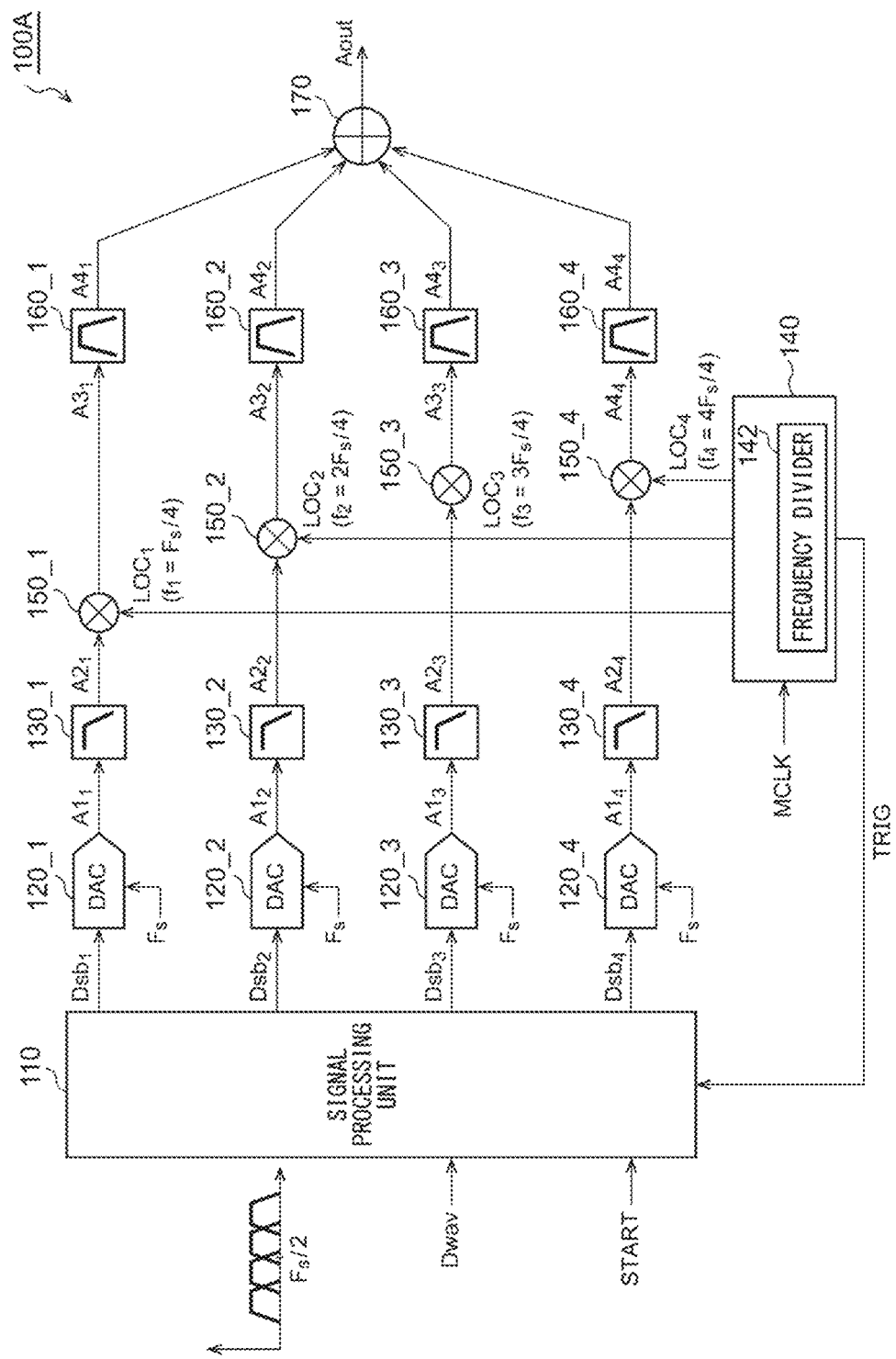
FIG. 5 is a diagram showing a four-channel signal generator.

FIG. 5 is a diagram showing a four-channel (N=4) signal generator 100A. In this example, there is a difference of $F_S/4$ (=$F_S/N$) between two adjacent center frequencies from among those of the four (=N) sub-band components $SB_1$ through $SB_4$.

Furthermore, the frequencies of the local signals $LOC_1$ through $LOC_4$ are $F_S/4$, $2F_S/4$, $3F_S/4$, and $4F_S/4$, respectively. That is to say, the difference between adjacent frequencies of the local signals LOC' through $LOC_4$ is the same, i.e., $F_S/4$. In general, in a case in which the number of channels is represented by N, the difference between the adjacent frequencies of the local signals $LOC_1$ through $LOC_4$ may preferably be designed to be $F_S/N$.

It should be noted that the difference between two adjacent center frequencies from among those of the multiple sub-band components $SB_1$ through $SB_4$ may be $F_S \cdot M/L$. Here, M and L each represent an arbitrary integer where L>M. The value M/L is not restricted to an integer. Also, M/L may also be a rational number. This allows the bandwidths of the N sub-band components to be equal. As a result, this allows the multiple channels to be configured in the same manner in the stages downstream from the D/A converter.

L/M and N may also be different integers.

In this example, the local signal generating circuit 140 includes a frequency divider 142. The frequency divider 142 receives the master clock MCLK having a frequency that is equal to or higher than $F_S$ ($K \cdot F_S$, where K represents a coefficient that is equal to or higher than 1), and frequency-divides the master clock MCLK by different frequency-dividing ratios (4×K, 4/2×K, 4/3×K, 4/4×K) so as to generate the local signals $LOC_1$ through $LOC_4$ having frequencies of $F_S/4$, $2F_S/4$, $3F_S/4$, and $4F_S/4$. For example, an arrangement may be made in which K=4.

The digital signal processing unit 110 receives the input of a start signal START to be used as a trigger for starting waveform output. After the start signal START is asserted (set to high, for example), the digital signal processing unit 110 starts the output of the N items of sub-band waveform data $Dsb_1$ through $Dsb_4$ after a timing at which the phases of the multiple local signals $LOC_1$ through $LOC_N$ align.

The local signal generating circuit 140 further generates a synchronization signal SYNC that indicates a timing at which the phases of the N local signals $LOC_1$ through $LOC_N$ align. The synchronization signal SYNC is input to the digital signal processing unit 110.

When the next synchronization signal SYNC is generated after the assertion of the start signal START, the digital signal processing unit 110 supplies the multiple items of sub-band waveform data $Dsb_1$ through $Dsb_4$ to the D/A converters 120_1 through 120_4, so as to start waveform reproduction.

The multiple first filters 130_1 through 130_N are each configured as a low-pass filter having the same cutoff frequency.

The multiple second filters 160_1 through 160_4 are configured as bandpass filters having different pass bands. Specifically, the pass band of each second filter 160_i is designed to allow the sub-band $SB_1$ of the original digital waveform data Dwav to pass.

Figure 6:
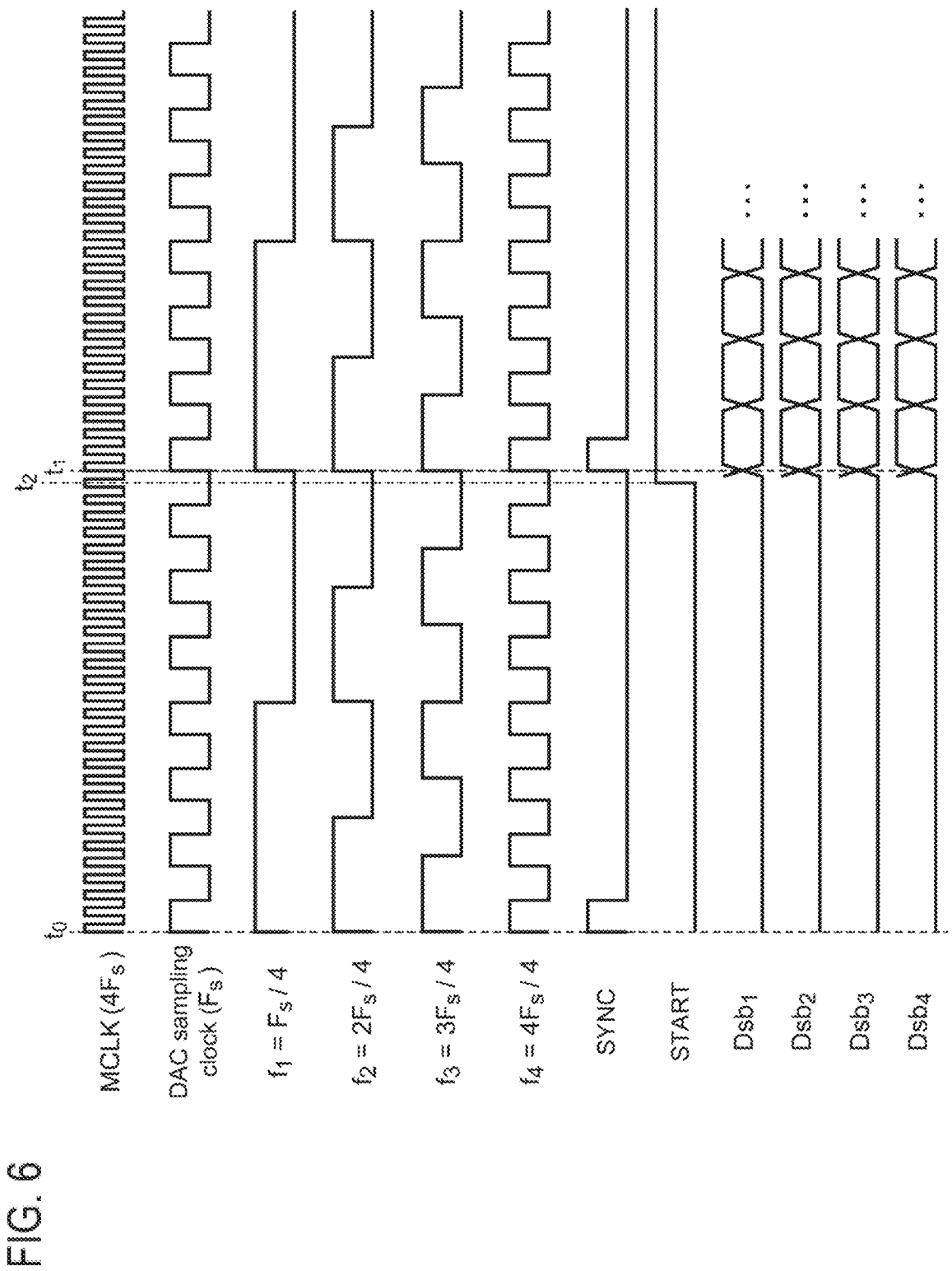
FIG. 6 is an operation waveform diagram showing the operation of the signal generator shown in FIG. 5.

FIG. 6 is an operation waveform diagram showing the operation of the signal generator 100A shown in FIG. 5. The time points $t_0$, $t_1$, . . . , represent the timings at which the phases of the multiple local signals $LOC_1$ through $LOC_4$ align. The synchronization signal SYNC is repeatedly asserted at such timings.

At the time point $t_2$, the start signal START is asserted. However, the digital signal processing unit 110 does not immediately start the output of the multiple items of sub-band waveform data $Dsb_1$ through $Dsb_4$. After waiting for the next assertion (time point $t_1$) of the synchronization signal SYNC, the digital signal processing unit 110 starts the output.

The above is the operation of the signal generator 100A shown in FIG. 5. With the signal generator 100A, this is capable of starting the waveform reproduction in a state in which the phases of the multiple local signals $LOC_1$ through $LOC_4$ align. This allows the analog output signal Aout to be output with improved accuracy.

The embodiments show only an aspect of the mechanisms and applications of the present invention. Rather, various modifications and various changes in the layout can be made without departing from the spirit and scope of the present invention defined in appended claims.

What is claimed is:

1. A signal generator structured to generate an analog output signal based on digital waveform data, the signal generator comprising:
   a plurality of N digital to analog (D/A) converters, where N is an integer equal to or greater than 2, each structured to convert input data at a sampling frequency $F_S$;
   a digital signal processing unit structured to generate N items, where N is the integer equal to or greater than 2, of sub-band waveform data, and to supply the N items of sub-band waveform data to the N D/A converters, wherein each of the N items of sub-band waveform data is generated by frequency-shifting a corresponding one of N sub-band components, where N is the integer equal to or greater than 2, included in the digital waveform data in a manner that its maximum frequency is below $F_S/2$;
   N first filters, where N is the integer equal to or greater than 2, that correspond to the N D/A converters, each structured to filter an output signal of a corresponding one of the N D/A converters;
   a local signal generating circuit structured to generate N local signals, where N is the integer equal to or greater than 2, that correspond to the N sub-band components, wherein each of the N local signals has a frequency that corresponds to a difference between a center frequency of a corresponding one of the N sub-band components and a center frequency of the N items of sub-band waveform data;
   N analog frequency mixers, where N is the integer equal to or greater than 2, that correspond to the N first filters, each structured to frequency-mix an output signal of a corresponding one of the N first filters with a corresponding one of the N local signals;
   N second filters, where N is the integer equal to or greater than 2, that correspond to the N analog frequency mixers, each structured to filter an output signal of a corresponding one of the N analog frequency mixers; and
   a combiner structured to combine output signals of the N second filters.

2. The signal generator according to claim 1, wherein, with N, M, and L as integers where N≥3 and L>M, a difference between two adjacent center frequencies of the N sub-band components is represented by $F_S·M/L$.

3. The signal generator according to claim 2, wherein L/M is an integer.

4. The signal generator according to claim 3, wherein the N local signals have frequencies $F_S/N$, $2F_S/N$, . . . , $N·F_S/N$.

5. The signal generator according to claim 2, wherein the local signal generating circuit further generates a synchronization signal indicating a timing at which phases of the N local signals align.

6. The signal generator according to claim 5, wherein the digital signal processing unit starts to output the N items of sub-band waveform data with the synchronization signal as a trigger.

7. The signal generator according to claim 3, wherein the local signal generating circuit comprises a frequency-dividing circuit structured to divide the frequency of a common clock signal with different frequency-dividing ratios so as to generate the N local signals.

8. The signal generator according to claim 1, wherein the digital signal processing unit corrects a mismatch between a plurality of paths downstream from the N D/A converters.

9. The signal generator according to claim 8, wherein the digital signal processing unit corrects skew that occurs between the plurality of paths.

10. The signal generator according to claim 8, wherein the digital signal processing unit corrects a mismatch of frequency characteristics between the plurality of paths.

11. An arbitrary waveform generating method for generating an analog output signal based on digital waveform data, the arbitrary waveform generating method comprising:
   providing N digital to analog (D/A) converters, where N is an integer equal to or greater than 2, each structured to operate at a sampling frequency $F_S$;
   generating N items, where N is the integer equal to or greater than 2, of sub-band waveform data, wherein each of the N items of sub-band waveform data is generated by frequency-shifting a corresponding one of N sub-band components, where N is the integer equal to or greater than 2, included in the digital waveform data in a manner that its center frequency matches a baseband frequency $F_{BB}$;

generating N first signals, where N is the integer equal to or greater than 2, wherein each of N D/A converters converts corresponding one of the N items of sub-band waveform data to one of the N first signals;

filtering the N first signals so as to generate N second signals, where N is the integer equal to or greater than 2;

generating N local signals, where N is the integer equal to or greater than 2, that correspond to the N sub-band components, wherein each of N local signals has a frequency that corresponds to a difference between a center frequency of a corresponding one of the N sub-band components and the baseband frequency $F_{BB}$;

frequency-mixing each of the N second signals with a corresponding one of the N local signals to generate N third signals, where N is the integer equal to or greater than 2;

filtering the N third signals to generate N fourth signals, where N is the integer equal to or greater than 2; and combining the N fourth signals so as to generate the analog output signal.

12. The arbitrary waveform generating method according to claim 11, further comprising:

generating a synchronization signal indicating a timing at which phases of the N local signals align; and starting to generate the N first signals with the synchronization signal as a trigger.

* * * * *